(12) United States Patent
Luiten et al.

(10) Patent No.: US 9,984,852 B1
(45) Date of Patent: May 29, 2018

(54) TIME-OF-FLIGHT CHARGED PARTICLE SPECTROSCOPY

(71) Applicant: FEI Company, Hillsboro, OR (US)

(72) Inventors: Otger Jan Luiten, Eindhoven (NL); Petrus Henricus Antonius Mutsaers, Geldrop (NL); Jasper Frans Mathijs van Rens, Hegelsom (NL); Wouter Verhoeven, Eindhoven (NL); Erik René Kieft, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days. days.

(21) Appl. No.: 15/364,145

(22) Filed: Nov. 29, 2016

(30) Foreign Application Priority Data

Nov. 28, 2016 (EP) .................................... 16200849

(51) Int. Cl.
*G01N 23/00* (2006.01)
*H01J 37/26* (2006.01)
*H01J 37/20* (2006.01)

(52) U.S. Cl.
CPC .............. *H01J 37/26* (2013.01); *H01J 37/20* (2013.01); *H01J 2237/2802* (2013.01)

(58) Field of Classification Search
None
See application file for complete search history.

(56) References Cited

U.S. PATENT DOCUMENTS

| | | | | |
|---|---|---|---|---|
| 5,345,080 A * | 9/1994 | Yajima | ..................... | H01J 37/26 250/311 |
| 6,218,664 B1 * | 4/2001 | Krans | ..................... | H01J 37/28 250/310 |
| 7,154,091 B2 * | 12/2006 | Zewail | ................... | H01J 37/065 250/311 |
| 7,569,841 B2 * | 8/2009 | Hill | ...................... | H01J 37/1474 250/397 |
| 8,101,928 B2 * | 1/2012 | Hill | ...................... | H01J 37/1474 250/397 |
| 8,314,409 B2 * | 11/2012 | Miller | .................. | H01J 37/1472 250/307 |

(Continued)

OTHER PUBLICATIONS

"Electron Microscope", Wikipedia, Retrieved from the Internet Oct. 15, 2015, http://en.wikipedia.org/wiki/Electron_microscope, 11 pages.

(Continued)

*Primary Examiner* — Andrew Smyth
(74) *Attorney, Agent, or Firm* — Scheinberg & Associates, PC; Michael O. Scheinberg

(57) ABSTRACT

An apparatus for performing charged particle spectroscopy, comprising:
A source, for producing a pulsed beam of charged particles that propagate along a beam path;
A specimen holder, for holding a specimen at an irradiation position in said beam path;
A detector arrangement, for performing energy-differentiated detection of charged particles that traverse said specimen,
wherein, between said source and said detector arrangement, said beam path successively traverses:
An energizing cavity, for applying a time-dependent accelerating field to said beam;
A primary drift space;
Said irradiation position;
A temporal focusing cavity, for converting an energy differential in said beam into a time-of-flight differential;
A secondary drift space.

20 Claims, 1 Drawing Sheet

(56) References Cited

U.S. PATENT DOCUMENTS

| | | | | |
|---|---|---|---|---|
| 2005/0006582 A1* | 1/2005 | Steigerwald | ............ | H01J 37/05 250/311 |
| 2005/0253069 A1* | 11/2005 | Zewail | ................. | H01J 37/065 250/311 |
| 2012/0261586 A1* | 10/2012 | Knippels | ............... | H01J 37/045 250/396 R |
| 2014/0103225 A1* | 4/2014 | Kieft | ....................... | H01J 37/28 250/440.11 |
| 2017/0243713 A1 | 8/2017 | Kieft et al. | | |

OTHER PUBLICATIONS

"Focused Ion Beam", Wikipedia, Retrieved from the Internet Jul. 11, 2016, https://en.wikipedia.org/wiki/Focused_ion_beam, 7 pages.

"Scanning Electron Microscope", Wikipedia. Retrieved from the Internet Jul. 25, 2016, http://en.wikipedia.org/wiki/Scanning_electron_microscope, 23 pages.

"Scanning Helium Ion Microscope", Wikipedia, Retrieved from the Internet on Jul. 25, 2016, http://en.wikipedia.org/wiki/Scanning_Helium_Ion_Microscope, 2 pages.

"Scanning Transmission Electron Microscopy", Wikipedia, Retrieved from the Internet Jul. 25, 2016, http://en.wikipedia.org/wiki/Scanning_transmission_electron_microscopy, 5 pages.

"Transmission Electron Microscopy", Wikipedia, Retrieved from the Internet Jul. 25, 2016, http://en.wikipedia.org/wiki/Transmission_electron_microscopy, 23 pages.

Escovitz, W.H. et al., "Scanning Transmission Ion Microscope with a Field Ion Source," Proc. Nat. Acad. Sci. USA, May 1975, pp. 1826-1828, vol. 72, No. 5.

Fehr, J., et al., "A 100-Femtosecond Electron Beam Blanking System," Microelectronic Engineering, 1990, pp. 221-226, vol. 12.

Lassise, A., et al., "Compact, low power radio frequency cavity for femtosecond electron microscopy," Review of Scientific Instruments, 2012, 10 pages, vol. 83.

Ura, Katsumi, et al., "Picosecond Pulse Stroboscopic Scanning Electron Microscope", 1978, pp. 247-252, vol. 27, No. 4.

Varentsov, D. et al. "First biological images with high-energy proton microscopy", Physica Medica (2013), pp. 208-213, vol. 29.

* cited by examiner

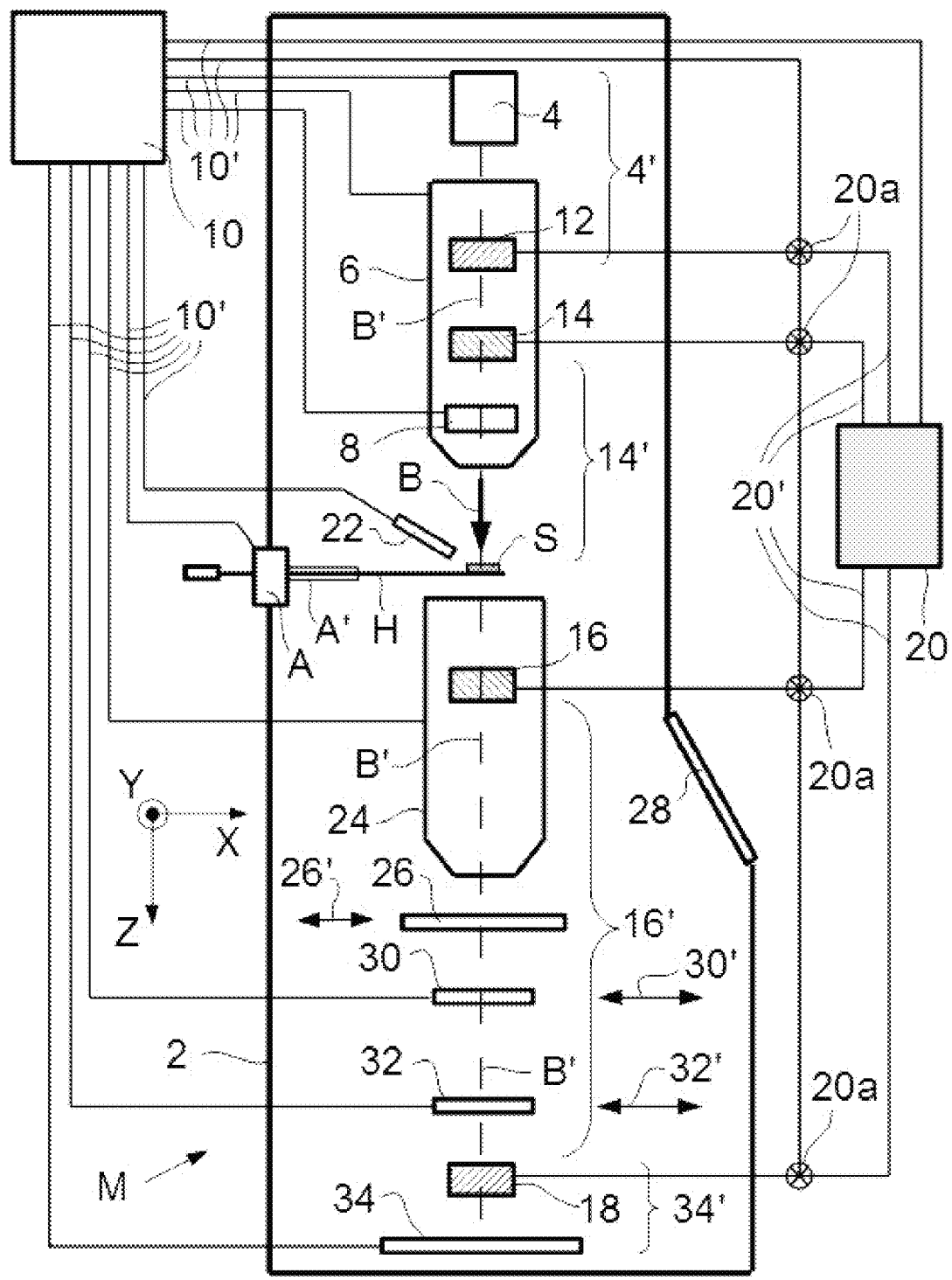

TIME-OF-FLIGHT CHARGED PARTICLE SPECTROSCOPY

The invention relates to an apparatus for performing charged particle spectroscopy, comprising:
- A source, for producing a pulsed beam of charged particles that propagate along a beam path;
- A specimen holder, for holding a specimen at an irradiation position in said beam path;
- A detector arrangement, for performing energy-differentiated detection of charged particles that traverse said specimen.

The term "traverse" as here applied can refer to transmission (through) or reflection (from) the specimen.

The invention also relates to a method of using such an apparatus.

The invention additionally relates to a charged particle microscope in which such an apparatus is comprised.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
- en.wikipedia.org/wiki/Electron_microscope
- en.wikipedia.org/wiki/Scanning_electron_microscope
- en.wikipedia.org/wiki/Transmission_electron_microscopy
- en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
- en.wikipedia.org/wiki/Focused_ion_beam
- en.wikipedia.org/wiki/Scanning_Helium_Ion_Microscope
- W. H. Escovitz, T. R. Fox and R. Levi-Setti, Scanning Transmission Ion Microscope with a Field Ion Source, Proc. Nat. Acad. Sci. USA 72(5), pp 1826-1828 (1975). www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged Particle Microscope (CPM) will comprise at least the following components:
- A radiation source, such as a Schottky electron source or ion gun.
- An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the beam w.r.t. the specimen. In general, such a specimen holder will be connected to a positioning system such as a mechanical stage.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the case of a transmission-type microscope (such as a (S)TEM, for example), the CPM will also comprise:
- An imaging system, which essentially takes charged particles that are transmitted through a specimen (plane) and directs (focuses) them onto analysis apparatus, such as a detection/imaging device, spectroscopic apparatus (such as an EELS device; EELS=Electron Energy–Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

An example of an apparatus as set forth in the opening paragraph above is a time-of-flight EELS device. In traditional EELS, an electron beam that has passed through a specimen—and thereby acquired a spectral signature—is directed through a dispersion device, such as a particle prism, in which an electromagnetic field is used to produce a transverse deflection of the electrons in the beam; since the deflection radius of a given electron will depend on its energy, this mechanism can be used to resolve the "polychromatic" post-specimen beam into a transverse array of energy-sorted sub-beams. Drawbacks of this approach, however, are that the employed dispersion device tends to be relatively expensive and bulky, and the whole set-up necessarily occupies a significant transverse footprint. In an alternative proposal—which, to date, has not been commercially viable—a time-of-flight approach is employed, whereby use is made of the fact that an electron's post-specimen speed will depend on the energy-loss that it sustained in traversing the specimen, which will translate into a time-of-flight differential between the specimen and the employed detector set-up. However, the tiny time-of-flight differences between the constituent electrons of the post-specimen beam are difficult to mutually differentiate, so that this approach suffers from a relatively coarse (and, to date, unacceptable) energy resolution.

It is an object of the invention to address this issue. More specifically, it is an object of the invention to provide a time-of-flight charged particle spectroscopy apparatus/method with which a greatly improved energy resolution can be obtained. Moreover, it is an object of the invention that this new apparatus/method should be more versatile than existing proposals in this area.

These and other objects are achieved in an apparatus as set forth in the opening paragraph above, characterized in that, between said source and said detector arrangement, said beam path successively traverses:

An energizing cavity, for applying a time-dependent accelerating field to said beam;
A primary drift space;
Said irradiation position;
A temporal focusing cavity, for converting an energy differential in said beam into a time-of-flight differential;
A secondary drift space.

The skilled artisan will understand that the term "cavity" as here employed refers to a resonant cavity, often referred to as a Radio Frequency (RF) cavity or microwave cavity.

In essence, the operation of such a set-up exploits inter alia the following innovative effects:

The energizing cavity (between the pulsed source and the specimen) is used to deliberately introduce a correlated energy spread (effectively a de-focus) in the beam before it impacts upon the specimen. This is done by generating a time-dependent acceleration field inside the cavity. As a result, in the primary drift space that follows, each charged particle pulse spreads in time—which, in turn, leads to a reduction of the instantaneous energy spread (due to conservation of phase space). Lower instantaneous energy spread at the specimen ultimately means better energy resolution. A similar pulse spreading effect could, in principle, be achieved without use of the energizing cavity, but the primary drift space would then have to be (prohibitively) longer; moreover, in such a set-up, one would not have the flexibility of tuning the magnitude of the beam-spreading effect (and even reversing its sign) as offered by the present invention.

The temporal focusing cavity (between the specimen and the detector arrangement) creates a "temporal focus" at the position (entrance plane) of the detector arrangement—meaning that charged particles in a nominal beam (without interaction with a specimen) are made to arrive at the detector arrangement with a shortened (optimally: shortest possible) temporal spread; on the other hand, beam particles that have lost/gained energy in the specimen will arrive at a different time. The secondary drift space serves to magnify this effect, resulting in a temporal focus that allows a highly accurate correlation of arrival time to energy. Moreover, the total energy spread in the beam consists of an "uncorrelated" (instantaneous) energy spread in addition to a "correlated" energy spread (where average energy depends linearly on arrival time), and this correlated energy spread component can be advantageously regulated away as part of the action of the temporal focusing cavity.

The energizing cavity can be used to arrange the phase space of the beam according to desire. If one wants to achieve a good energy resolution, the beam pulses can be stretched before reaching the specimen; alternatively, if one wants to achieve improved temporal resolution (e.g. when monitoring time-dependent processes), the beam pulses can be compressed.

Exploiting these effects, the inventors have realized an exceptionally good energy resolution of 20 meV for a total beam path length of 2 meters, starting from a continuous electron beam with an energy spread of 1 eV. Such a total path length is compatible with incorporation of the set-up in a CPM such as a TEM, for example, in which the particle-optical column already has a de facto length of this order of magnitude. Without application of the invention, a much coarser optimum energy resolution would have to be accepted, at a required path length that would be (significantly) longer than a CPM's particle-optical column.

In an embodiment of the invention, at least one (and preferably both) of said energizing cavity and said temporal focusing cavity comprises a $TM_{010}$ cavity. According to standard usage in the field of electromagnetism, the symbol "TM" indicates a Transverse Magnetic field, i.e. an electromagnetic field that has no longitudinal magnetic component (so that B=0 along the z-axis), whereas the triplet of subscripts "010" denotes integer eigenvalues of a wave vector k needed to satisfy boundary conditions pertaining to Maxwell's equations in the cavity. A $TM_{010}$ cavity has an azimuthal magnetic field which is zero at radius r=0 (measured outward from the z-axis) and a non-zero (time-varying), on-axis longitudinal electric field, which can be used to either stretch or compress an entrant pulse train—depending on the phase of the field; this therefore makes it suitable to fulfil the role of the energizing cavity (axial stretching/de-bunching) and/or the temporal focusing cavity (axial compression/bunching). As a possible alternative to a $TM_{010}$ mode, one could, in principle, use another monopole mode with a longitudinal electric field at r=0: more specifically, any mode $TM_{0np}$ where n and p are integers, with n>0 and p≥0.

In a specific embodiment of the invention, the detector arrangement comprises a $TM_{110}$ cavity. A $TM_{110}$ mode is a dipole mode with a strong lateral magnetic field at r=0 and zero electric field at r=0. When incorporated into the detector arrangement of the present invention, it can be employed to produce a lateral deflection of charged particles in the entrant beam, whereby the amplitude of said lateral deflection for a particular particle depends on its time of arrival at the cavity (since this determines the phase of the oscillating cavity field that the particle will experience). In this manner, a (longitudinal) collection of different times-of-arrival is converted into a (lateral) collection of different deflection amplitudes, whose corresponding intensities/currents can be (separately) registered using one or more (fixed or movable) sensors such as photodiodes, (solid state) photo-multipliers, etc. As a potential alternative, one could avoid such lateral deflection and instead "directly" register the longitudinal train of particles (with different times-of-arrival) using a detector with a very fast sampling/reset rate, such as a pixelated array of avalanche photodiodes/solid state photomultiplier, for instance.

In another embodiment of the invention, said source comprises a $TM_{110}$ cavity. Use of a $TM_{110}$ cavity to chop a continuous beam (from a continuous source, such as a Schottky gun or liquid metal ion source, for example) is advantageous in that it can share a common RF excitation source with the abovementioned $TM_{110}$ cavity in the detector arrangement, which allows convenient ((semi-)automatic) synchronization of source pulses with the operating frequency of the detector arrangement. In addition, such a $TM_{110}$ cavity can be used to produce high-coherence pulses. As an alternative to the use of a $TM_{110}$ cavity in this manner, one could instead use pulsed laser triggering, e.g. as in the case of laser-induced photoelectric emission (of electrons or positive ions) from a target such as a metallic foil or disk, $LaB_6$ filament, Schottky filament, etc.

For completeness, it should be noted that a $TM_{110}$ mode as referred to in the previous two paragraphs can, for example, be excited in a cavity with the aid of a Hertzian dipole loop antenna placed close to the wall of the cavity (distal from the z-axis). An antenna of this type can, for example, be achieved by:
  Creating a small bore in a wall of the cavity;
  Feeding the inner conductor of a coaxial cable through this bore to the interior of the cavity, in such a way that said inner conductor does not touch said (conducting) wall;
  Creating a loop in said inner conductor proximal to said wall;
  Orienting the loop appropriately (e.g. so that its plane is normal to the y-axis, to excite a magnetic field parallel to y);
  Connecting said coaxial cable to an oscillating Radio Frequency (RF) excitation source (power supply/amplification stage).

The vibrational behavior of the cavity can be adjusted in various ways. For example, the frequency of said oscillating excitation source can be altered. Alternatively, a small conducting (e.g. metallic) or dielectric "plunger" (tuning element) can be partially inserted into the cavity, e.g. through a small bore opposite the above-mentioned antenna; the extent of insertion of such a plunger will then influence the resonant frequency of the cavity, because:
  Insertion of a conducting plunger will locally decrease the effective radius of the cavity, with an attendant increase in resonant frequency;
  Insertion of a dielectric plunger will increase the effective dielectric constant of the cavity, with an attendant decrease in resonant frequency.

Needless to say, when the cavity is excited on-resonance (i.e. the frequency of the oscillating excitation source is matched to the resonant frequency of the cavity), the resulting electromagnetic fields in the cavity will be at their largest. The skilled artisan will be familiar with such concepts, and will be able to implement and optimize them according to the details/requirements of a particular configuration; in particular, he will realize that other types and/or locations of antenna (or other means of excitation) can be employed, as well as other types and/or locations of tuning element/plunger. The skilled artisan will also understand that similar considerations apply to the abovementioned $TM_{010}$ mode, except in that the abovementioned excitation antenna may have a different orientation to the $TM_{110}$ case. As regards the geometry of a resonant cavity used in the present invention, this may, for example, be a so-called "pillbox cavity" (which is essentially cylindrical in form), though other shapes are also possible, as in the case of so-called "nose cone" or "re-entrant" cavities, for example, which tend to be more power-efficient for a $TM_{010}$ mode (by reducing magnetic fields near the cavity walls, thereby reducing Ohmic losses). In the case of a beam-chopping $TM_{110}$ cavity/mode, efficiency can be improved by (partly) filling the cavity with a suitable dielectric material.

The skilled artisan will understand that, in order to achieve optimum results, the various cavities referred to above (i.e. beam chopping cavity (source), energizing cavity, temporal focusing cavity, and lateral deflection cavity (detector arrangement)) can be matched to one another as regards frequency/phase. In this regard, one could, for example, connect all of them to the same RF excitation source, with a phase adjuster in the path to each cavity; alternatively, one could connect each cavity to its own RF excitation source, and tune these sources so as to mutually match.

It should be noted that, in certain situations, it may be advantageous to use a series array of multiple cavities—as opposed to a solitary cavity—to fulfill/complement a given cavity role as set forth above. This may be advantageous if, for example, a single cavity cannot produce a satisfactory effect within given ancillary parameters—such as a sufficiently strong field within an available space—in which case an array of successive cavities can be employed to produce a cumulative effect. In such a set-up, the terminal drift space after the last cavity in the array may be shortened if an intermediate drift space is created between successive members of the array. In a particular embodiment of a multiple-cavity series array, a supplementary $TM_{010}$ ow cavity is provided directly upstream or downstream of the temporal focusing cavity, and is configured to produce a second harmonic and reversed phase of the excitation in said temporal focusing cavity (at a zero crossing). Attainable resolution is typically limited by longitudinal aberrations, but can be improved by adding said supplementary cavity, which acts to remove first-order "spherical" aberrations. To understand this, it should be noted that the electric field in the temporal focusing cavity has a sinusoid temporal shape, and the invention will work most optimally if a beam pulse enters the temporal focusing cavity only during a sufficiently linear part of said sinusoid (i.e. close to a zero crossing); if the pulse is "too long" before recompression, then the temporal focus will be affected by aberration effects analogous to spherical aberration in conventional focusing optics. One way of ensuring such linearity is to tailor the beam pulses to be sufficiently short; however, if this is not (sufficiently) feasible, then said supplementary cavity acts to mitigate any non-linearity effects present.

As already alluded to above (when discussing the energizing cavity), the present invention can be advantageously used when:
  Said specimen has a property that changes as a function of time;
  Said pulsed beam is used to assemble a temporal series of momentary (spectroscopic) snapshots of said specimen, thereby capturing temporal evolution of said property.

Such a scenario can be likened somewhat to stroboscopic photography, in which the pulsed beam impinging upon the specimen provides stroboscopic illumination and the (appropriately synchronized) detector arrangement captures corresponding "freeze-frame" spectroscopic "imagery" of the specimen. Since there will generally be a relatively limited number of charged particles per individual pulse, one will generally need to collect several pulses per "image" in order to realize sufficient signal-to-noise ratio. Examples of temporal processes in this context include, for example, phase transitions, plasmonic excitations, mechanical vibrations, heat dissipation, chemical reactions, biological cell division, crystal growth, specimen motion (e.g. specimens passing through a flow tube), etc.

The invention will now be elucidated in more detail on the basis of an exemplary embodiment and the accompanying schematic drawing, in which:

FIG. 1 renders a longitudinal cross-sectional elevation of a particular type of CPM in which an embodiment of the current invention is implemented.

In the FIGURE, corresponding features may be denoted using corresponding reference symbols.

Embodiment 1

FIG. 1 is a highly schematic depiction of an embodiment of a CPM M in which an embodiment of the current invention is implemented; in this case, the CPM is a (S)TEM, though, in the context of the current invention, it could just as validly be an ion-based or proton microscope, for example, or a SEM. In the FIGURE, within a vacuum enclosure 2, a continuous electron source 4 (such as a Schottky emitter, for example) produces a beam (B) of electrons that traverse an electron-optical illuminator 6, serving to direct/focus them onto a chosen part of a specimen S (which may, for example, be (locally) thinned/planarized). This illuminator 6 has an electron-optical axis B', and will generally comprise a variety of electrostatic/magnetic lenses, (scan) deflector(s) 8, correctors (such as stigmators), etc.; typically, it can also comprise a condenser system (in fact, the whole of item 6 is sometimes referred to as "a condenser system").

The specimen S is held on a specimen holder H. As here illustrated, part of this holder H (inside enclosure 2) is mounted in a cradle A' that can be positioned/moved in multiple degrees of freedom by a positioning device (stage) A; for example, the cradle A' may (inter alia) be displaceable in the X, Y and Z directions (see the depicted Cartesian coordinate system), and may be rotated about a longitudinal axis parallel to X. Such movement allows different parts of the specimen S to be irradiated/imaged/inspected by the electron beam traveling along axis B' (and/or allows scanning motion to be performed as an alternative to beam scanning [using deflector(s) 8], and/or allows selected parts of the specimen S to be machined by a (non-depicted) focused ion beam, for example).

The (focused) electron beam B traveling along axis B' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of sensor 22, which might be a combined scintillator/photomultiplier or EDX (Energy-Dispersive X-Ray Spectroscopy) module, for instance; in such a case, an image/spectrum could be constructed using basically the same principle as in a SEM. However, of principal importance in a (S)TEM, one can instead/supplementally study electrons that traverse (pass through) the specimen S, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of sensing device/analysis apparatus can be used downstream of screen 26, such as:

TEM camera 30. At camera 30, the electron flux can form a static image (or diffractogram) that can be processed by controller 10 and displayed on a display device (not depicted), such as a flat panel display, for example. When not required, camera 30 can be retracted/withdrawn (as schematically indicated by arrows 30') so as to get it out of the way of axis B'.

STEM detector 32. An output from detector 32 can be recorded as a function of (X,Y) scanning position of the beam B on the specimen S, and an image can be constructed that is a "map" of output from detector 32 as a function of X,Y. Typically, detector 32 will have a much higher acquisition rate (e.g. $10^6$ points per second) than camera 30 (e.g. $10^2$ images per second). In conventional tools, detector 32 can comprise a single pixel with a diameter of e.g. 20 mm, as opposed to the matrix of pixels characteristically present in camera 30. Once again, when not required, detector 32 can be retracted/withdrawn (as schematically indicated by arrows 32') so as to get it out of the way of axis B' (although such retraction would not be a necessity in the case of a donut-shaped annular dark field detector 32, for example; in such a detector, a central hole would allow beam passage when the detector was not in use).

As an alternative to imaging using camera 30 or detector 32, one can also invoke spectroscopic sensor 34, which can be used to perform EELS spectroscopy in accordance with the present invention, as explained below. It should be noted that the order/location of items 30, 32 and 34 is not strict, and many possible variations are conceivable. For example, spectroscopic sensor 34 can also be integrated into the imaging system 24 (requiring item 18 to be re-located also).

Note that the controller/computer processor 10 is connected to various illustrated components via control lines (buses) 10'. This controller 10 can provide a variety of functions, such as synchronizing actions, providing setpoints, processing signals, performing calculations, and displaying messages/information on a display device (not depicted). Needless to say, the (schematically depicted) controller 10 may be (partially) inside or outside the enclosure 2, and may have a unitary or composite structure, as desired. The skilled artisan will understand that the interior of the enclosure 2 does not have to be kept at a strict vacuum; for example, in a so-called "Environmental (S)TEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, detector 32, spectroscopic detector 34, etc.

In the context of the current invention, the microscope M comprises four RF cavities 12, 14, 16 and 18, whose function can be explained as follows:

Cavity 12 is a $TM_{110}$ cavity that is used as a beam chopper, so as to pulse the beam emerging from continuous/static source 4. Together with continuous source 4, it can be regarded as forming a composite pulsed beam source 4'.

Cavity 14 is a $TM_{010}$ cavity that acts as an energizing cavity as set forth above and in the claims. As already explained, it acts as a de-buncher/stretcher of the beam B upstream of the specimen S. Between energizing cavity 14 and specimen S, there is a primary drift space 14', which serves as a sort of "enhancer", by affording a proportional phase space change (change in time-energy correlation) produced in cavity 14 an increased longitudinal extent in which to manifest itself before reaching cavity 16.

Cavity 16 is a $TM_{010}$ cavity that acts as temporal focusing cavity as set forth above and in the claims. As already explained, it acts as a buncher/compressor of the beam B after it traverses the specimen S and before it enters the detector arrangement 34'. Between temporal focusing cavity 16 and detector arrangement 34', there is a secondary drift space 16', which analogously serves as a sort of "enhancer", by affording a proportional phase space change (change in time-energy correlation) produced in cavity 16 an increased longitudinal extent in which to manifest itself before reaching cavity 18.

Cavity 18 is a $TM_{110}$ cavity that is used as a lateral deflector, serving to convert a (longitudinal) collection of different times-of-arrival in beam B into a (lateral) collection of different deflection amplitudes, whose corresponding intensities/currents can be (separately) registered using sensor 34. Together with sensor 34, it can be regarded as forming a composite detector arrangement 34'. The sensor 34 may, for example, be a laterally extending (pixelated) array of photodiodes (for parallel/simultaneous detection), or it may be a laterally movable, localized sensor (for serial/sequential detection). These cavities 12, 14, 16 and 18 are arranged on beam bath B', and each is provided with an entrance and exit aperture (usually, a pair of oppositely-located, small, axial holes) to allow them to be traversed by beam B. Each is connected to an RF excitation source 20 (in this case a common source, but it could alternatively be a plurality of separate sources) via a driving line 20' and a regulator 20a, the latter being usable to individually adjust characteristics (e.g. amplitude) of the driving waveforms being sent to each of the cavities 12, 14, 16, 18. When these cavities are not needed (e.g. because the CPM M is being used to collect imagery rather than spectroscopic data), they can simply be switched off; alternatively/supplementally, one or more of them can mounted on a retraction mechanism that can be used to move them out of the path of beam B (and move them back into position when required).

For the sake of giving some design guidance, the following non-limiting specifications deserve mention:

The (average) energy of the electrons emerging from source 4 is 30 keV.

All cavities 12, 14, 16, 18 are excited at a frequency of ~2.998 GHz (European standard s-band).

Pulses emerging from the chopper cavity 12 have an energy spread of ~0.6 eV FWHM (Full Width at Half Maximum) and a duration of ~100 fs (femtoseconds).

The primary drift space 14' has a length of ~40 cm, whereas the secondary drift space 16' has a length of ~95 cm. The total beam path length between cavities 12 and 18 is ~2 meters. There is a (discretionary) space of ~5 cm between the specimen S and cavity 16.

Both $TM_{010}$ cavities 14, 16 have an effective length (in the direction of beam B) of ~17 mm.

The energizing cavity 14 is operated with a peak electric field on-axis of ~2.2 MV/m. If an electron pulse passes it at an ideal phase (zero crossing of the field when the pulse is in the heart of the cavity), a total energy spread of ~47 eV FWHM is created. Such a pulse is stretched to a temporal duration of ~2.9 ps by the time it arrives at the specimen S. The total energy spread is still ~47 eV FWHM, but the instantaneous (uncorrelated) spread is reduced to ~18 meV (milli electron volts).

The temporal focusing cavity 16 has a peak electric field of ~115 kV/m; it does not need to be as strong as that of cavity 14, because pulses are already stretched at this point.

Ultimately, detection energy resolution is ~23 meV. This is somewhat higher than the uncorrelated spread in the specimen, because the detection is somewhat aberration-limited. As mentioned above, a supplementary, second-harmonic cavity could mitigate such aberration and thereby slightly improve this resolution—whereby the improvement will be bigger if one works with longer pulses.

The invention claimed is:

1. An apparatus for performing charged particle spectroscopy, comprising:
   a source, for producing a pulsed beam of charged particles that propagate along a beam path;
   a specimen holder, for holding a specimen at an irradiation position in said beam path; and
   a detector arrangement, for performing energy-differentiated detection of charged particles that traverse said specimen,
wherein between said source and said detector arrangement, said beam path successively traverses:
   an energizing cavity, for applying a time-dependent accelerating field to said beam;
   a primary drift space;
   said irradiation position;
   a temporal focusing cavity, for converting an energy differential in said beam into a time-of-flight differential; and
   a secondary drift space.

2. An apparatus according to claim 1, wherein at least one of said energizing cavity and said temporal focusing cavity comprises a $TM_{010}$ cavity.

3. An apparatus according to claim 1, wherein said detector arrangement comprises a $TM_{110}$ cavity.

4. An apparatus according to claim 1, wherein said source comprises a $TM_{110}$ cavity.

5. An apparatus according to claim 1, wherein a supplementary $TM_{010}$ cavity is provided directly upstream or downstream of the temporal focusing cavity, and is configured to produce a second harmonic and reversed phase of the excitation in said temporal focus cavity.

6. An apparatus according to claim 1, wherein said apparatus is comprised in a charged particle microscope.

7. An apparatus according to claim 6, which is an EELS module.

8. A method of performing charged particle spectroscopy, comprising:
   using a source to produce a pulsed beam of charged particles that propagate along a beam path;
   holding a specimen at an irradiation position in said beam path;
   using a detector arrangement to perform energy-differentiated detection of charged particles that traverse said specimen,
   upstream of said irradiation position, using an energizing cavity to apply a time-dependent accelerating field to said beam, and then passing the beam through a primary drift space; and
   downstream of said irradiation position and upstream of said detector arrangement, using a temporal focusing cavity to convert an energy differential in said beam into a time-of-flight differential, and then passing the beam through a secondary drift space.

9. A method according to claim 8, wherein:
   specimen has a property that changes as a function of time; and
   pulsed beam is used to assemble a temporal series of momentary spectroscopic snapshots of said specimen, thereby capturing temporal evolution of said property.

10. An apparatus according to claim 2, wherein said detector arrangement comprises a $TM_{110}$ cavity.

11. An apparatus according to claim 2, wherein said source comprises a $TM_{110}$ cavity.

12. An apparatus according to claim 3, wherein said source comprises a $TM_{110}$ cavity.

13. An apparatus according to claim 2, wherein a supplementary $TM_{010}$ cavity is provided directly upstream or downstream of the temporal focusing cavity, and is configured to produce a second harmonic and reversed phase of the excitation in said temporal focus cavity.

14. An apparatus according to claim 3, wherein a supplementary $TM_{010}$ cavity is provided directly upstream or downstream of the temporal focusing cavity, and is configured to produce a second harmonic and reversed phase of the excitation in said temporal focus cavity.

15. An apparatus according to claim 4, wherein a supplementary $TM_{010}$ cavity is provided directly upstream or downstream of the temporal focusing cavity, and is configured to produce a second harmonic and reversed phase of the excitation in said temporal focus cavity.

16. An apparatus according to claim 2, wherein said apparatus is comprised in a charged particle microscope.

17. An apparatus according to claim 3, wherein said apparatus is comprised in a charged particle microscope.

18. An apparatus according to claim 4, wherein said apparatus is comprised in a charged particle microscope.

19. An apparatus according to claim 5, wherein said apparatus is comprised in a charged particle microscope.

20. An apparatus according to claim 16, which is an EELS module.

* * * * *